(12) United States Patent
Chen et al.

(10) Patent No.: US 10,477,725 B2
(45) Date of Patent: Nov. 12, 2019

(54) CLUSTERED HEAT DISSIPATION DEVICE AND CHASSIS WITH SAME

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/217,390

(22) Filed: Dec. 12, 2018

(65) Prior Publication Data

US 2019/0182984 A1 Jun. 13, 2019

Related U.S. Application Data

(60) Provisional application No. 62/598,133, filed on Dec. 13, 2017.

(30) Foreign Application Priority Data

Nov. 30, 2018 (TW) .............................. 107143053 A (51) Int. Cl.
| | |
|---|---|
| *H05K 7/20* | (2006.01) |
| *F28D 15/00* | (2006.01) |
| *F28F 21/02* | (2006.01) |
| *F28F 21/08* | (2006.01) |
| *H05K 5/02* | (2006.01) |

(52) U.S. Cl.
CPC ......... *H05K 7/20272* (2013.01); *F28D 15/00* (2013.01); *F28F 21/02* (2013.01); *F28F 21/082* (2013.01); *F28F 21/085* (2013.01); *H05K 5/0213* (2013.01); *H05K 7/20254* (2013.01); *H05K 7/20263* (2013.01); *H05K 7/20772* (2013.01)

(58) Field of Classification Search
CPC ........... H05K 7/20254; H05K 7/20272; H05K 7/20772
See application file for complete search history.

(56) References Cited

U.S. PATENT DOCUMENTS

| | | | | |
|---|---|---|---|---|
| 8,027,162 B2 * | 9/2011 | Campbell | ............ | H05K 7/2079 165/104.33 |
| 8,164,902 B2 * | 4/2012 | Matsushima | ...... | H05K 7/20809 165/104.26 |
| 8,605,437 B2 * | 12/2013 | Wei | .................... | H05K 7/20781 361/699 |

(Continued)

*Primary Examiner* — Robert J Hoffberg
(74) *Attorney, Agent, or Firm* — WPAT, PC (57) ABSTRACT

A clustered heat dissipation device and a chassis are provided. The clustered heat dissipation device includes a heat-absorbing manifold, plural heat-absorbing heads and plural connection pipes. The heat-absorbing manifold includes an inlet chamber and an outlet chamber. The inlet chamber includes at least one first liquid inlet and plural first liquid outlets. The outlet chamber includes plural second liquid inlets and at least one second liquid outlet. The heat-absorbing manifold is in thermal contact with a first heat source. The plural connection pipes are connected with the heat-absorbing heads and the corresponding first liquid outlets and connected with the heat-absorbing heads and the corresponding second liquid inlets.

20 Claims, 9 Drawing Sheets

(56) References Cited

U.S. PATENT DOCUMENTS

| | | | | |
|---|---|---|---|---|
| 8,922,998 B2* | 12/2014 | Campbell | .......... | H05K 7/20272 |
| | | | | 165/154 |
| 9,351,428 B2* | 5/2016 | Eckberg | ............. | H05K 7/20772 |
| 10,024,606 B2* | 7/2018 | Arvelo | ...................... | F28F 1/00 |
| 10,104,810 B2* | 10/2018 | Arvelo | ............... | H05K 7/20272 |
| 10,111,364 B2* | 10/2018 | Arvelo | .............. | H05K 7/20272 |
| 10,342,159 B2* | 7/2019 | Wan | ................... | H05K 7/20263 |
| 10,385,996 B2* | 8/2019 | Arvelo | ...................... | F15D 1/00 |
| 2017/0181317 A1* | 6/2017 | Wan | .......................... | F28F 3/12 |
| 2019/0072334 A1* | 3/2019 | Xiao | ....................... | F28D 15/00 |

* cited by examiner

CLUSTERED HEAT DISSIPATION DEVICE AND CHASSIS WITH SAME

CROSS-REFERENCE TO RELATED APPLICATION

This application claims priority to U.S. Provisional Patent Application No. 62/598,133 filed Dec. 13, 2017, the contents of which are incorporated herein by reference.

FIELD OF THE INVENTION

The present invention relates to a heat dissipation device, and more particularly to a clustered heat dissipation device for a chassis.

BACKGROUND OF THE INVENTION

In the large-sized heat dissipation system, a manifold has the function of delivering or collecting the cooling liquid. The manifold is not responsible of absorbing heat or dissipating heat. For example, the cooling water manifold is used for receiving the cooling liquid and transferring the cooling liquid to various water-cooling heads. The hot water manifold is used for collecting the heated water and transferring the heated water to an external condenser or cooler. However, the manifold itself occupies a specified space. In case that the manifold has the function of absorbing the heat or has the functions of other components, the heat-dissipating performance is increased while maintaining or reducing the volume of the overall heat dissipation system.

SUMMARY OF THE INVENTION

For overcoming the drawbacks of the large-sized heat dissipation system, the present invention provides a clustered heat dissipation device. The clustered heat dissipation device is applied to a server in a rack cabinet or an electronic device or an appliance with plural heat sources. Moreover, the clustered heat dissipation device is used for simultaneously absorbing or removing the heat that is generated by the plural heat sources. More especially, the clustered heat dissipation device is equipped with a heat-absorbing manifold. The heat-absorbing manifold has the functions of a manifold and a water-cooling head. Consequently, the overall heat dissipating performance is enhanced.

In accordance with an aspect of the present invention, there is provided a clustered heat dissipation device. The clustered heat dissipation device includes a heat-absorbing manifold, plural heat-absorbing heads and plural connection pipes. The heat-absorbing manifold includes an inlet chamber and an outlet chamber. The inlet chamber includes at least one first liquid inlet and plural first liquid outlets. The outlet chamber includes plural second liquid inlets and at least one second liquid outlet. The heat-absorbing manifold is in thermal contact with a first heat source. The plural connection pipes are connected with the heat-absorbing heads and the corresponding first liquid outlets and connected with the heat-absorbing heads and the corresponding second liquid inlets.

In an embodiment, the heat-absorbing heads are in thermal contact with a second heat source.

In an embodiment, the first heat source and the second heat source are different heat generation elements, or the first heat source and the second heat source are different heat generation sites of the same heat generation element.

In an embodiment, the inlet chamber and the outlet chamber are separately arranged along a vertical direction, or the inlet chamber and the outlet chamber are separately arranged along a horizontal direction.

In an embodiment, each of the heat-absorbing head has a single-compartment structure or a multi-compartment structure.

In an embodiment, the heat-absorbing manifold is made of silver, copper, gold, aluminum, iron, alloy, or graphite, wherein the alloy contains at least one of silver, copper, gold, aluminum and iron.

Preferably, while a heat-dissipating function of the clustered heat dissipation device is executed, a cooling liquid is introduced into the connection pipes.

In an embodiment, the first liquid inlet is connected with a cooling liquid supply pipe. The cooling liquid with a decreased temperature is received by the first liquid inlet and transferred to the plural heat-absorbing heads through the plural first liquid outlets.

In an embodiment, the second liquid outlet is connected with a cooling liquid exhaust pipe. The cooling liquid with an increased temperature is transferred to an external condenser or an external heat exchanger so as to be cooled down.

In an embodiment, the clustered heat dissipation device further includes a quick connector. The quick connector is connected with the corresponding first liquid outlet and the corresponding connection pipe or connected with the corresponding second liquid inlet and the corresponding connection pipe.

In an embodiment, the quick connector includes an outer sleeve element, an inner sleeve element and an elastic coil. The outer sleeve element includes an outer sleeve body with a wide opening part. The inner sleeve element includes an inner sleeve body and a covering part. The covering part includes an entrance and an accommodation space. When the outer sleeve element and the inner sleeve element are jointed with each other, the elastic coil is sheathed around the wide opening part, so that the wide opening part is locked in the accommodation space.

In an embodiment, a ring-shaped recess is formed in an external periphery of the inner sleeve body, and a gasket is received in the ring-shaped recess.

In accordance with another aspect of the present invention, there is provided a chassis. The chassis includes an electronic device, plural heat-absorbing heads and a heat-absorbing manifold. The electronic device has at least three heat sources. The plural heat-absorbing heads are in thermal contact with at least two of the at least three heat sources. The heat-absorbing manifold is connected with a cooling liquid supply pipe and a cooling liquid exhaust pipe. After a cooling liquid is distributed to the plural heat-absorbing heads and transferred through the plural heat-absorbing heads, a temperature of the cooling liquid is increased and the cooling liquid is collected to the cooling liquid exhaust pipe. The heat-absorbing manifold is in thermal contact with one of the at least three heat sources.

In an embodiment, the heat sources are individual heat generation elements, or the heat sources are different heat generation sites of the same heat generation element.

In an embodiment, the heat-absorbing manifold comprises an inlet chamber and an outlet chamber. The inlet chamber is connected with the cooling liquid supply pipe. The outlet chamber is connected with the cooling liquid exhaust pipe.

In an embodiment, the inlet chamber is in thermal contact with one of the at least three heat sources.

In an embodiment, the outlet chamber is in thermal contact with one of the at least three heat sources.

In an embodiment, the inlet chamber is connected with the plural heat-absorbing head through corresponding quick connectors and the corresponding connection pipes.

In an embodiment, the outlet chamber is connected with the plural heat-absorbing head through corresponding quick connectors and the corresponding connection pipes.

In an embodiment, the heat-absorbing manifold is made of silver, copper, gold, aluminum, iron, alloy, or graphite, wherein the alloy contains at least one of silver, copper, gold, aluminum and iron.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

In FIGS. 1 to 4, a clustered heat dissipation device 1 according to a first embodiment of the present invention is shown. The clustered heat dissipation device 1 comprises a heat-absorbing manifold 11, plural heat-absorbing heads 16, connection pipes 18A, 18B, and a cooling liquid (not shown). The heat-absorbing heads 16 are also referred as cold plates. The heat-absorbing manifold 11 comprises an inlet chamber 12 and an outlet chamber 13. The inlet chamber 12 comprises at least one liquid inlet 121 and plural liquid outlets 122. The outlet chamber 13 comprises plural liquid inlets 131 and at least one liquid outlet 132. The liquid inlet 121 of the inlet chamber 12 of the heat-absorbing manifold 11 is connected with a cooling liquid supply pipe 14. After a cooling liquid (not shown) with a lower temperature (i.e., with the decreased temperature) is received by the liquid inlet 121, the cooling liquid is transferred to the heat-absorbing heads 16 through the liquid outlets 122. The liquid outlet 132 of the outlet chamber 13 is connected with a cooling liquid exhaust pipe 15. After the cooling liquid is transferred through the heat-absorbing heads 16, the temperature of the cooling liquid is increased. After the cooling liquid with the higher temperature (i.e., with the increased temperature) is collected to the outlet chamber 13 through the liquid inlets 131, the cooling liquid is transferred to an external condenser or heat exchanger (not shown) through the cooling liquid exhaust pipe 15. Consequently, the cooling liquid is cooled down. After the cooling liquid is cooled down, the cooling liquid is returned to the inlet chamber 12 of the heat-absorbing manifold 11 through the cooling liquid supply pipe 14.

Figure 3A:
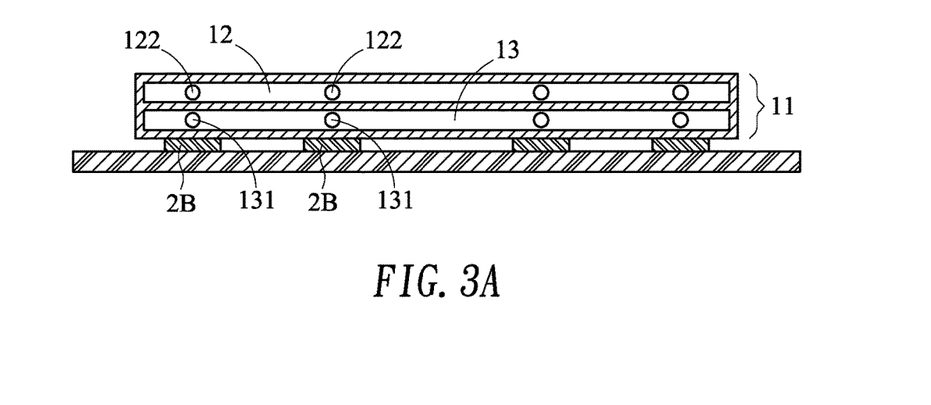
FIG. 3A is a schematic cross-sectional view illustrating the heat-absorbing manifold of the clustered heat dissipation device as shown in FIG. 1 and taken along the line 3-3.
Figure 3B:
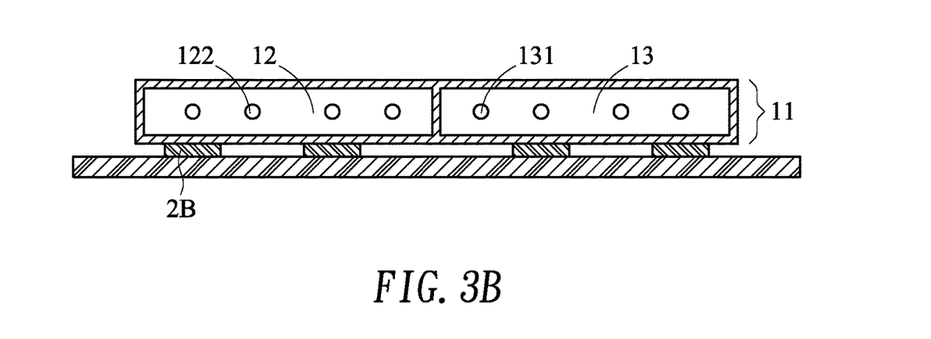
FIG. 3B is a schematic cross-sectional view illustrating a variant example of the heat-absorbing manifold of the clustered heat dissipation device.

The heat-absorbing heads 16 are in thermal contact with corresponding heat sources 2A of an electronic device 2. Consequently, when the cooling liquid is transferred through the inner portions of the heat-absorbing heads 16, the temperature of the cooling liquid is increased or the cooling liquid is subjected to a phase change to carry away the heat. Like the conventional manifold, the heat-absorbing manifold 11 of the present invention has the functions of diverting and collecting the cooling liquid. In addition, the heat-absorbing manifold 11 has the heat-absorbing function. The heat-absorbing manifold 11 is made of the material with good thermal conductivity. For example, the heat-absorbing manifold 11 is made of a metallic material, alloy or a nonmetallic material (e.g., graphite). As shown in FIGS. 3A and 3B, the heat-absorbing manifold 11 is in thermal contact with heat sources 2B of the electronic device 2 to absorb the heat from the heat sources 2B and transfer the heat to the cooling liquid. In this embodiment, the term "thermal contact" indicates that the heat-absorbing head 16 (or the heat-absorbing manifold 11) is directly attached on the corresponding heat source 2A or 2B or an intermediate medium (a thermal grease, an adhesive, a soldering material or a heat conduction block) is clamped between the heat-absorbing head 16 (or the heat-absorbing manifold 11) and the corresponding heat source 2A or 2B. In an embodiment, the heat source 2A or 2B is an individual heat generation element. Alternatively, the heat sources 2A and 2B are different heat generation sites of the same heat generation element. The examples of the thermal contact are not restricted as long as the heat-absorbing manifold 11 is directly in thermal contact with the heat source to absorb or carry away the heat from the heat source.

Figure 1:
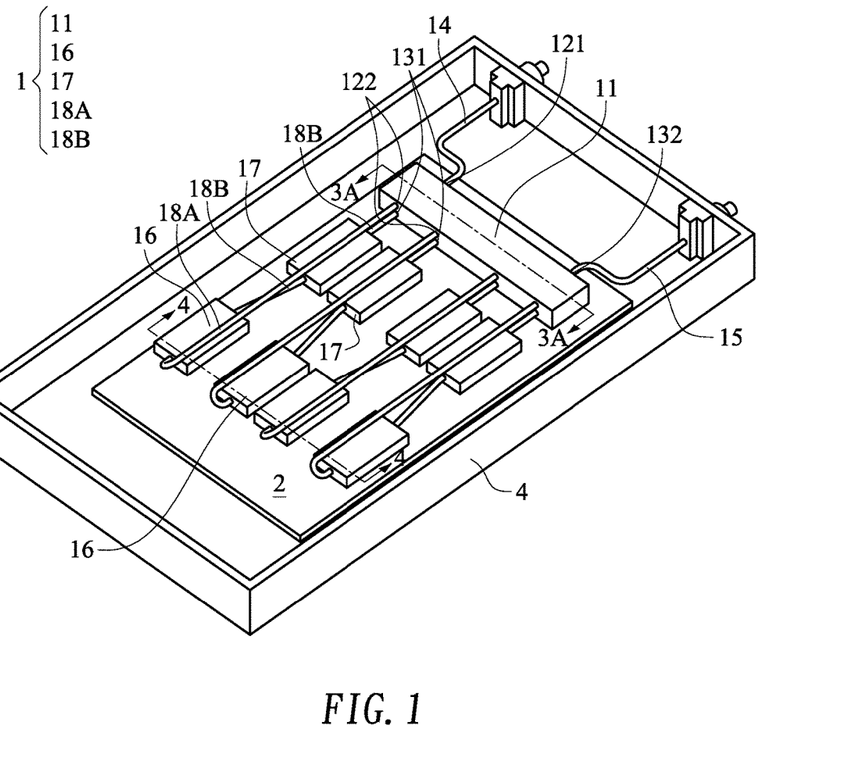
FIG. 1 is a schematic perspective view illustrating a clustered heat dissipation device according to a first embodiment of the present invention.
Figure 2:
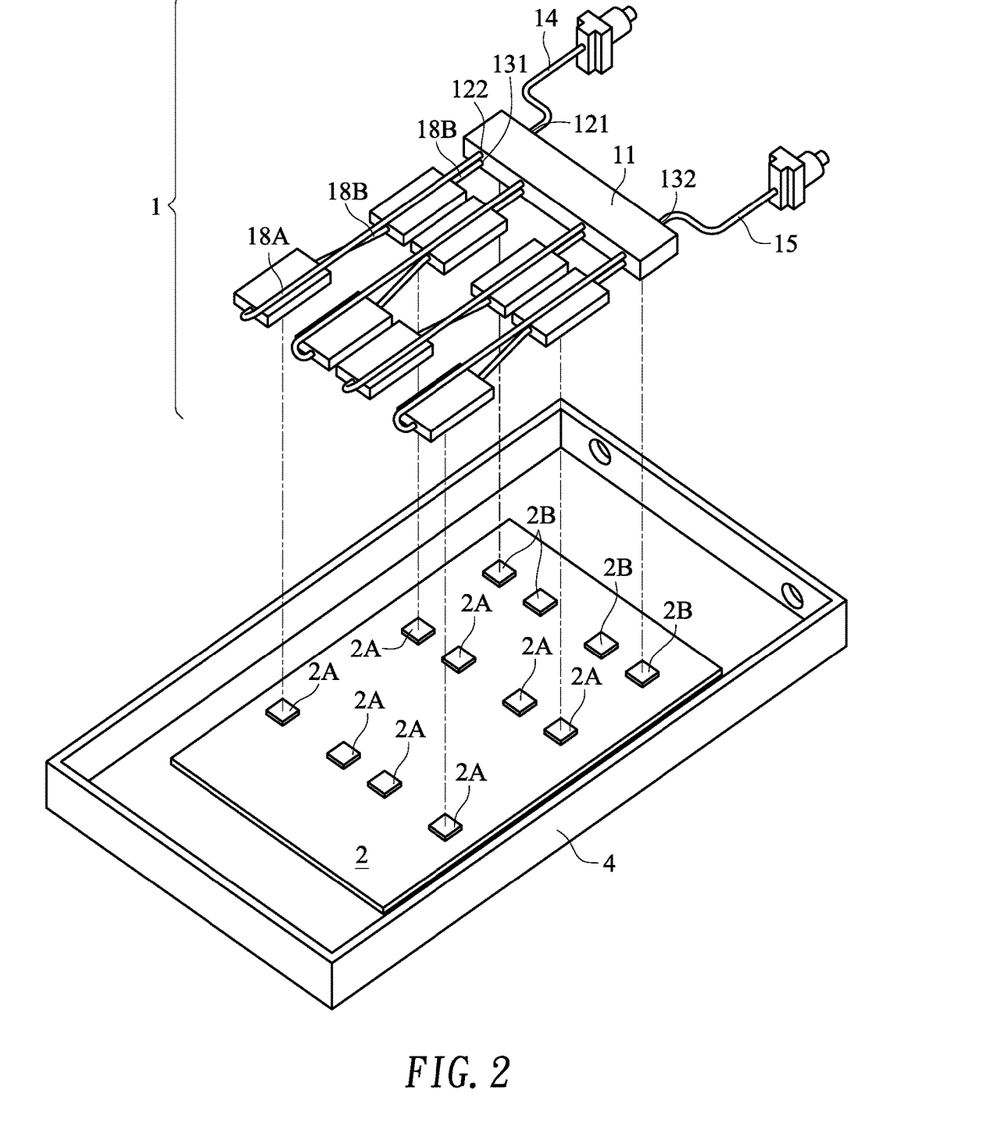
FIG. 2 is a schematic exploded view illustrating the clustered heat dissipation device according to the first embodiment of the present invention.

The clustered heat dissipation device 1 of the present invention is applied to the electronic device 2 with plural heat sources. For example, the electronic device 2 is a desktop host, a server, a small-sized computer, a medium-sized computer, a large-sized computer or a supercomputer. During the operation of the electronic device 2, some components of the electronic device 2 (e.g., CPU, GPU or memory module) generate a great deal of heat. That is, it is important to remove the heat from these components. As mentioned above, the clustered heat dissipation device 1 comprises the heat-absorbing manifold 11, and the heat-absorbing manifold 11 is connected with the cooling liquid supply pipe 14 or the cooling liquid exhaust pipe 15. Consequently, the clustered heat dissipation device 1 is suitably applied to a heat dissipation system of a rack cabinet (not shown). That is, the clustered heat dissipation device 1 is installed in the electronic device 2 that is disposed within a chassis 4. As shown in FIGS. 1 and 2, the clustered heat dissipation device 1 and the electronic device 2 are installed in the chassis 4. It is noted that the applications are not restricted.

In the clustered heat dissipation device 1 of this embodiment, the heat-absorbing manifold 11 cooperates with the plural heat-absorbing heads 16. According to the practical requirements or configurations, the heat-absorbing heads 16 are serially connected to or extended to other heat-absorbing heads 17. As shown in FIGS. 1 to 4, the number of the heat-absorbing heads 16 is 4. The number of the heat-absorbing heads 16 is not restricted as long as the number of the heat-absorbing heads 16 is not smaller than 2. The number of the heat-absorbing heads 17 to be serially connected with or extended from the heat-absorbing heads 16 is not restricted. Alternatively, the heat-absorbing heads 17 may be omitted.

In the clustered heat dissipation device 1 of this embodiment, the inlet chamber 12 and the outlet chamber 13 of the heat-absorbing manifold 11 are separated from each other and respectively located at an upper side and a lower side (see FIG. 3A). The outlet chamber 13 is in thermal contact with the heat sources 2B. In some other embodiments, the positions of the inlet chamber 12 and the outlet chamber 13 are exchanged. That is, the inlet chamber 12 is located at the lower side, and the outlet chamber 13 is located at the upper side. Consequently, the inlet chamber 12 is in thermal contact with the heat sources 2B. In some embodiments, the inlet chamber 12 and the outlet chamber 13 are not arranged along the vertical direction. In the embodiment as shown in FIG. 3B, the inlet chamber 12 and the outlet chamber 13 are arranged side by side along the horizontal direction. Under this circumstance, the inlet chamber 12 or the outlet chamber 13 is selectively to be in thermal contact with the heat sources 2B, or both of the inlet chamber 12 and the outlet chamber 13 are in thermal contact with the heat sources 2B.

In clustered heat dissipation device 1 of this embodiment, the heat-absorbing manifold 11 is a one-piece structure. That is, the inlet chamber 12 and the outlet chamber 13 are formed in the inner portion of the heat-absorbing manifold 11. In other embodiments, the inlet chamber 12 and the outlet chamber 13 are separated from each other. Consequently, the cooling liquid in the inlet chamber 12 is not influenced by the outlet chamber 13 with the higher temperature. Under this circumstance, the inlet chamber 12 or the outlet chamber 13 is selectively in thermal contact with the heat sources 2B to dissipate away the heat.

In clustered heat dissipation device 1 of this embodiment, the heat-absorbing heads 16 (or 17) are connected with the heat-absorbing manifold 11 through the connection pipes 18. For example, the liquid outlets 122 of the inlet chamber 12 of the heat-absorbing manifold 11 are connected with the corresponding heat-absorbing heads 16 through the connection pipes 18A. In addition, the heat-absorbing heads 16 (or 17) are connected with the liquid inlets 131 of the outlet chamber 13 of the heat-absorbing manifold 11 through the connection pipes 18B.

The operations of the clustered heat dissipation device 1 of this embodiment will be described as follows. After the cooling liquid is introduced into the inlet chamber 12 of the heat-absorbing manifold 11, the cooling liquid is transferred to the heat-absorbing heads 16. Consequently, the temperature of the cooling liquid is increased at the first time. Then, the cooling liquid is returned to the outlet chamber 13 of the heat-absorbing manifold 11. Since the heat from the heat sources 2B under the outlet chamber 13 is absorbed by the cooling liquid, the temperature of the cooling liquid is increased at the second time (or the third time). If the temperature of the heat source 2A is higher than the temperature of the heat source 2B or the heat source 2A generates more heat than the heat source 2B, this design is feasible. That is, when compared with the heat source 2B, the heat from the heat source 2A has the higher priority to be removed. It is noted that numerous modifications and alterations may be made while retaining the teachings of the invention. For example, if the temperature of the heat source 2B is higher than the temperature of the heat source 2A or the heat source 2B generates more heat than the heat source 2A, the positions of the inlet chamber 12 and the outlet chamber 13 of the heat-absorbing manifold 11 may be exchanged. For example, the inlet chamber 12 is located at the lower side, and the outlet chamber 13 is located at the upper side. After the cooling liquid is introduced into the inlet chamber 12 of the heat-absorbing manifold 11, the heat from the heat sources 2B under the outlet chamber 13 is absorbed by the cooling liquid. Consequently, the temperature of the cooling liquid is increased at the first time. Then, the cooling liquid is transferred to the heat-absorbing heads 16. Since the heat from the heat sources 2A is absorbed by the heat-absorbing heads 16, the temperature of the cooling liquid is increased at the second time. Then, the cooling liquid is returned to the upper-side outlet chamber 13 of the heat-absorbing manifold 11. In other words, the structure relationship between the inlet chamber 12 and the outlet chamber 13 of the heat-absorbing manifold 11 may be flexibly adjusted according to different heat-removing requirements.

Figure 4:
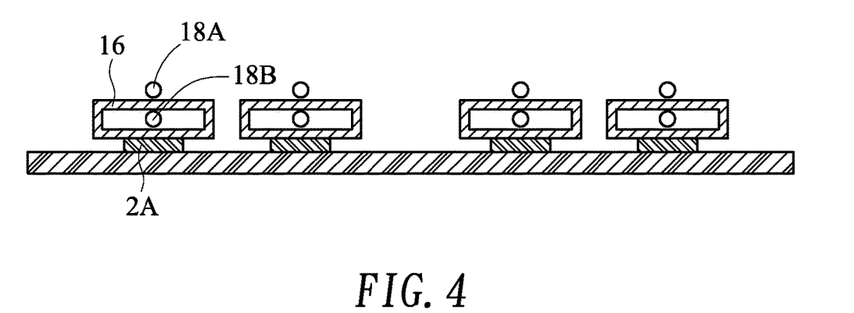
FIG. 4 is a schematic cross-sectional view illustrating the heat-absorbing heads of the clustered heat dissipation device as shown in FIG. 1 and taken along the line 4-4.

Please refer to the perspective view of the clustered heat dissipation device as shown in FIG. 1 and the cross-sectional view of the heat-absorbing heads 16 as shown in FIG. 4. In this embodiment, the heat-absorbing head 16 in cooperation with the heat-absorbing manifold 11 has a single-compartment structure. After the cooling liquid is transferred from the heat-absorbing manifold 11 through the connection pipe 18A, the cooling liquid is moved in the heat-absorbing heads 16 along a single direction. Then, the cooling liquid is returned back to the heat-absorbing manifold 11 through the connection pipe 18B. In some other embodiment, the heat-absorbing manifold 11 cooperates with the heat-absorbing head having a double-compartment structure or a multi-compartment structure.

Figure 5:
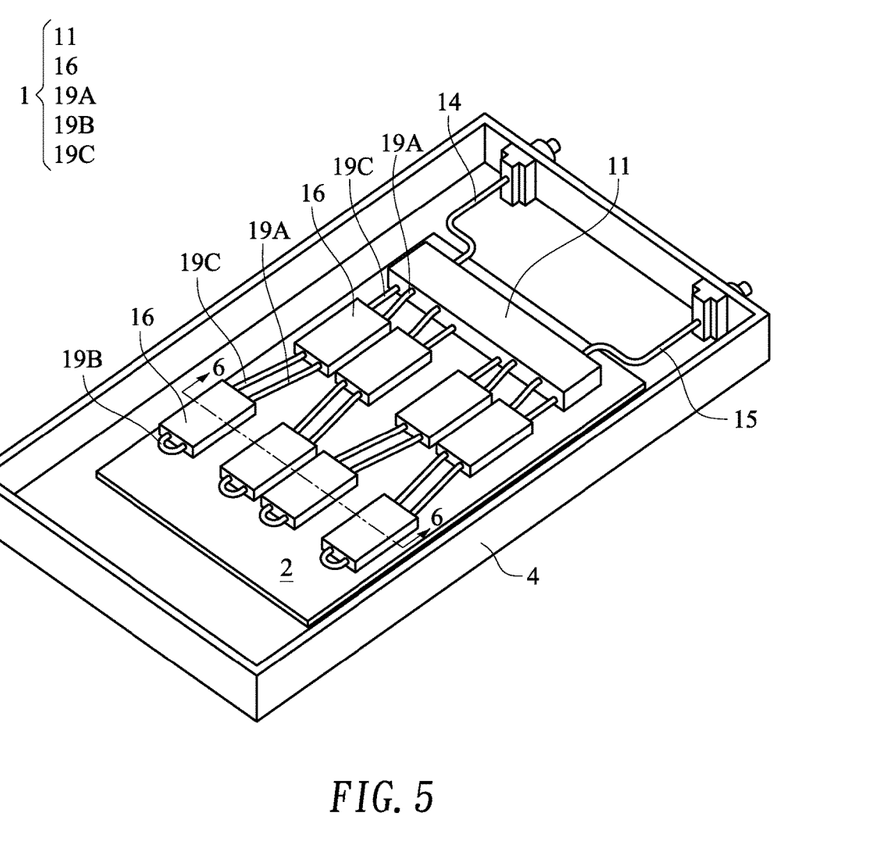
FIG. 5 is a schematic perspective view illustrating a clustered heat dissipation device according to a second embodiment of the present invention.
Figure 6:
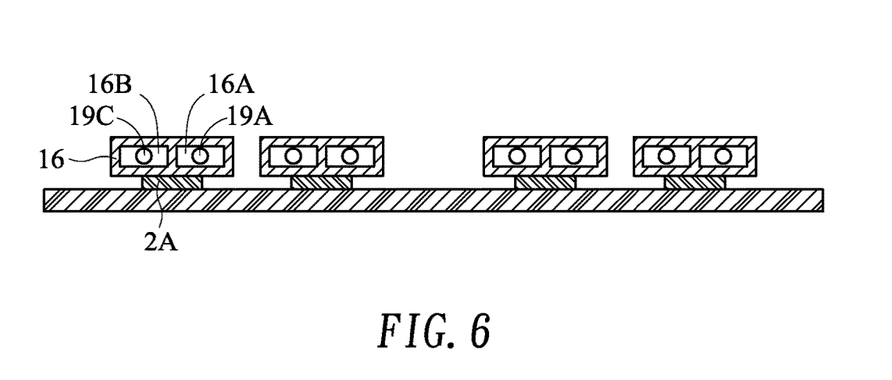
FIG. 6 is a schematic cross-sectional view illustrating the heat-absorbing heads of the clustered heat dissipation device as shown in FIG. 5 and taken along the line 6-6.

FIG. 5 is a schematic perspective view illustrating a clustered heat dissipation device according to a second embodiment of the present invention. FIG. 6 is a schematic cross-sectional view illustrating the heat-absorbing heads. The structures and operating principles of the heat-absorbing manifold 11, the cooling liquid supply pipe 14 and the cooling liquid exhaust pipe 15 of the clustered heat dissipation device of this embodiment are similar to those of the clustered heat dissipation device of the above embodiment, and are not redundantly described. In comparison with the above embodiment, the heat-absorbing head 16 in cooperation with the heat-absorbing manifold 11 has a double-compartment structure. As shown in FIG. 6, the heat-absorbing head 16 comprises compartments 16A and 16B. After the cooling liquid is outputted from the heat-absorbing manifold 11, the cooling liquid is transferred to the compartment 16A through the connection pipe 19A. When the cooling liquid is transferred through the compartment 16A, a portion of the heat from the heat source 2A under the corresponding compartment 16A is absorbed by the cooling liquid. Then, the cooling liquid is transferred to a next heat-absorbing head 16. Similarly, a portion of the heat from the underlying heat source 2A is absorbed by the cooling liquid. Then, the cooling liquid is transferred to the different compartment of the heat-absorbing head 16. Consequently, the cooling liquid is returned to the compartment 16B of the heat-absorbing head 16 to absorb a portion of the heat from the underlying heat source 2A. Afterwards, the cooling liquid is returned to the heat-absorbing manifold 11 through the connection pipe 19C. This design is advantageous. Since heat-absorbing manifold cooperates with the heat-absorbing heads 16 having the multi-compartment structures, the heat-absorbing heads 16 absorb the heat more uniformly. Since the temperature of the cooling liquid to be introduced into the heat-absorbing head at the terminal side of the piping system is not too high, the function of the heat-absorbing head is not adversely affected.

As mentioned above in the clustered heat dissipation device of the present invention, the heat-absorbing head in cooperation with the heat-absorbing manifold has a single-compartment structure or a multi-compartment structure. Preferably but not exclusively, the heat-absorbing manifold may cooperate with the same type of heat-absorbing heads or different types of heat-absorbing heads. In an embodiment, the inlet chamber or the outlet chamber of the heat-absorbing manifold is selectively in thermal contact with the heat sources. Alternatively, both of the inlet chamber and the outlet chamber are in thermal contact with the heat sources. Moreover, the inlet chamber and the outlet chamber are structurally connected with each other or separated from each other.

In the clustered heat dissipation device of the present invention, the heat-absorbing manifold is made of a metallic material with good thermal conductivity (e.g., silver, copper, gold, aluminum, iron or alloy of the above metallic materials) or a nonmetallic material with good thermal conductivity (e.g., graphite). It is noted that the material of the heat-absorbing manifold is not restricted.

Figure 7:
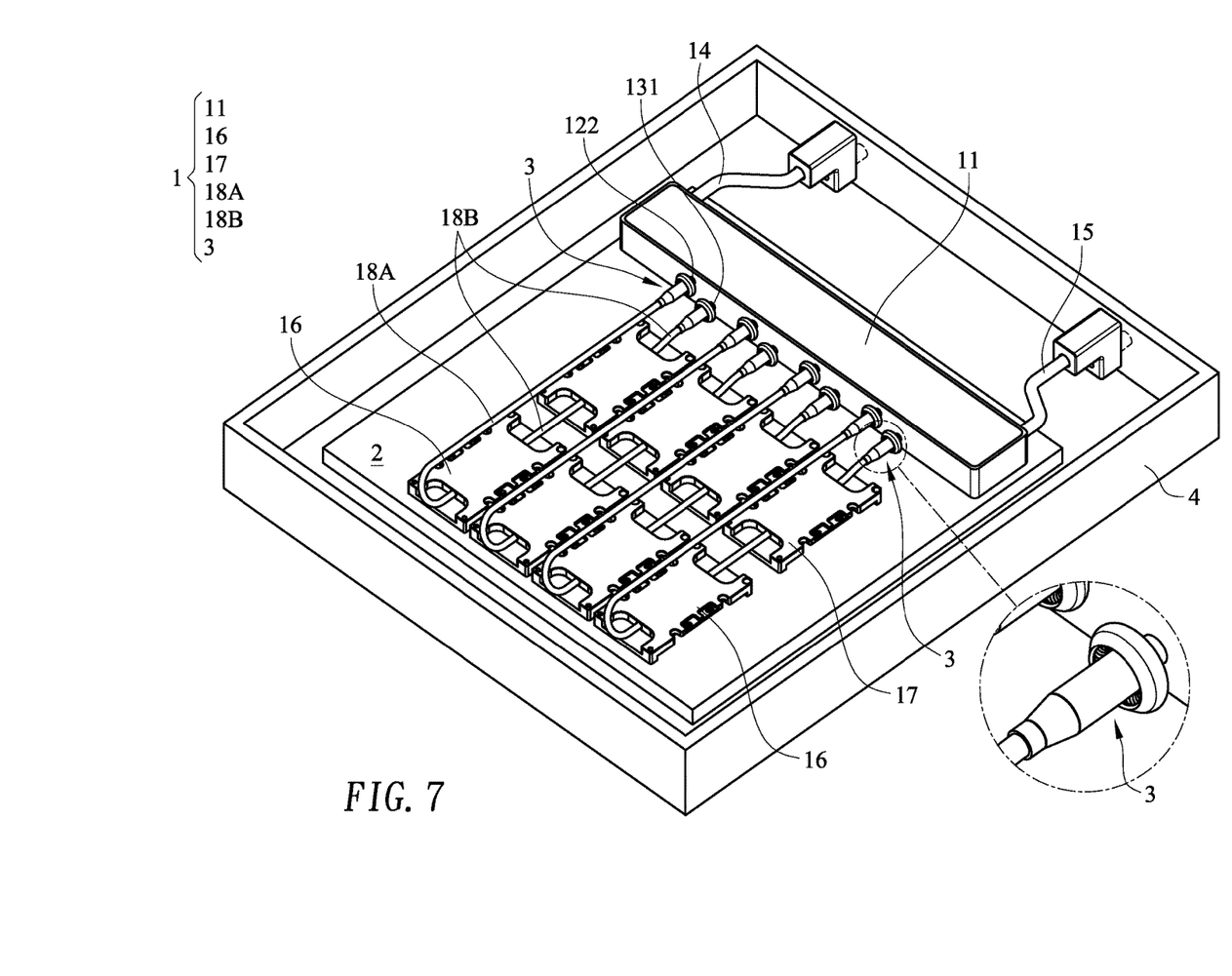
FIG. 7 is a schematic perspective view illustrating a clustered heat dissipation device according to a third embodiment of the present invention.

FIG. 7 is a schematic perspective view illustrating a clustered heat dissipation device according to a third embodiment of the present invention. The structure and operating principle of the clustered heat dissipation device of this embodiment are substantially similar to those of the first embodiment. In comparison with the first embodiment, a quick connector 3 is arranged between the liquid outlet 122 of the inlet chamber 12 of the heat-absorbing manifold 11 and the corresponding connection pipe 18A or arranged between the liquid inlet 131 of the outlet chamber 13 of the heat-absorbing manifold 11 and the corresponding connection pipe 18B according to the practical requirements. Due to the quick connector 3, the process of assembling or maintaining the clustered heat dissipation device is simplified.

Figure 8A:
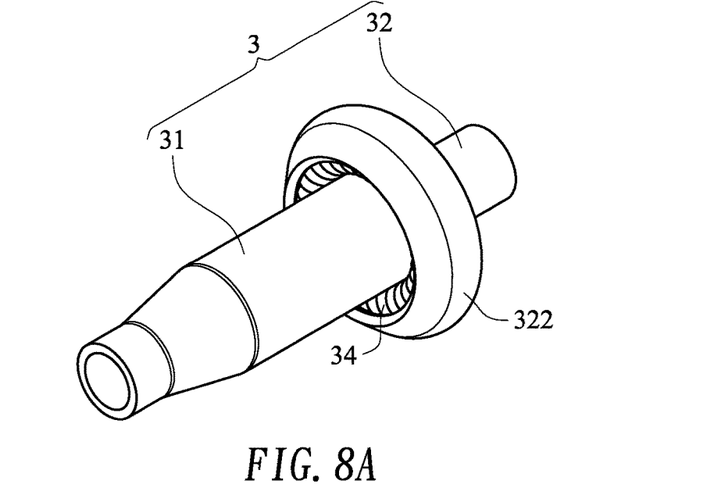
FIG. 8A is a schematic perspective view illustrating a quick connector of the clustered heat dissipation device according to the third embodiment of the present invention.
Figure 8B:
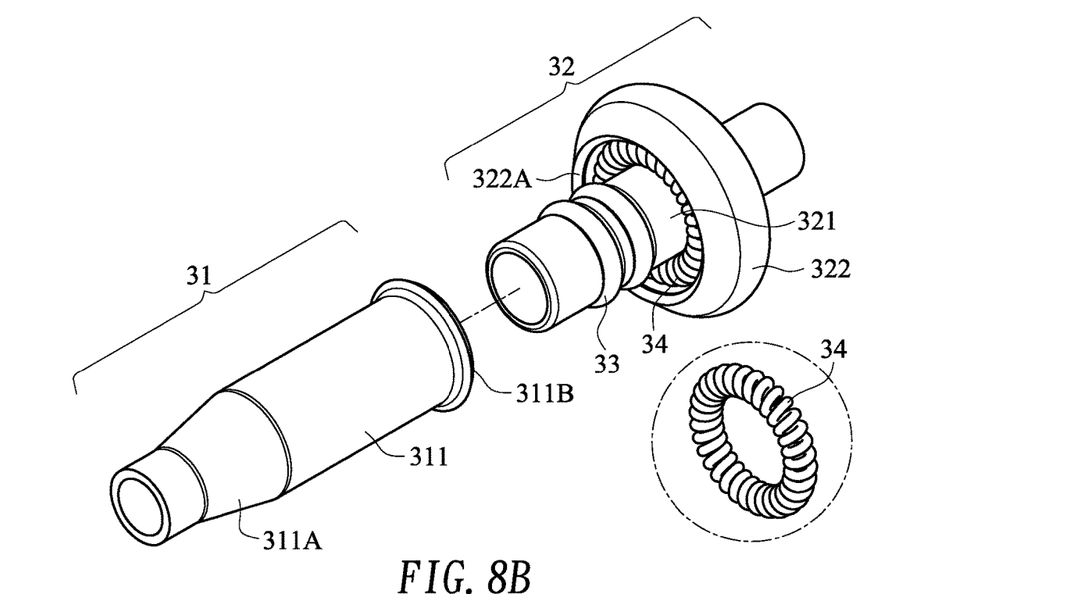
FIG. 8B is a schematic exploded view illustrating a quick connector of the clustered heat dissipation device according to the third embodiment of the present invention.
Figures 8C, 8D:
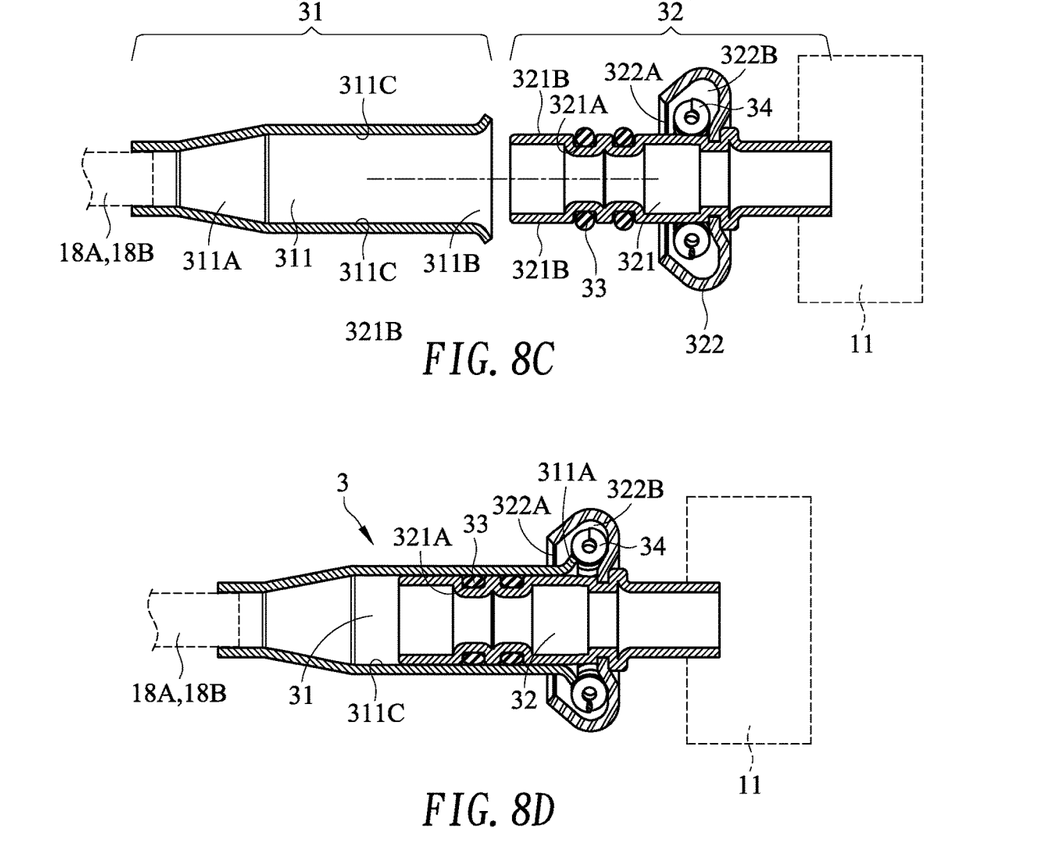
FIGS. 8C, 8D and 8E are schematic cross-sectional views illustrating a process of assembling the quick connector of the clustered heat dissipation device according to the third embodiment of the present invention.
Figure 8E:
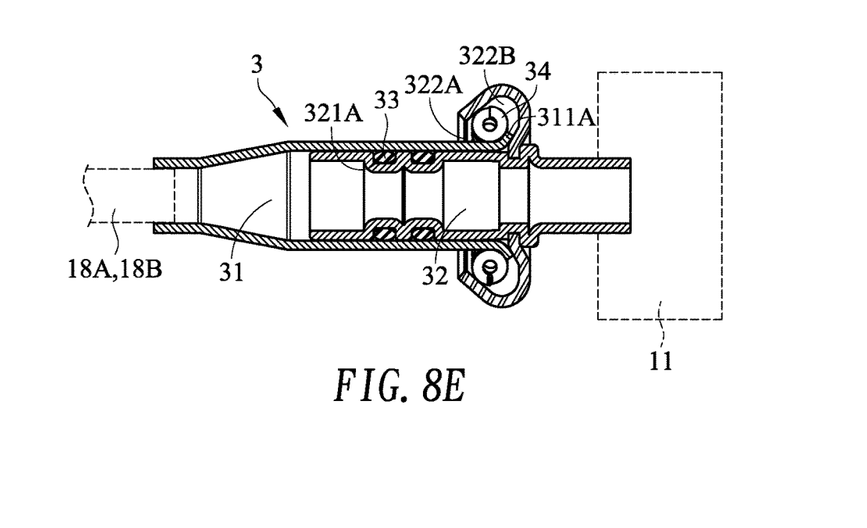

FIGS. 8A to 8E illustrate the structure and an assembling process of a quick connector 3. FIG. 8A is a schematic perspective view illustrating a quick connector of the clustered heat dissipation device according to the third embodiment of the present invention. FIG. 8B is a schematic exploded view illustrating a quick connector of the clustered heat dissipation device according to the third embodiment of the present invention. FIGS. 8C, 8D and 8E are schematic cross-sectional views illustrating a process of assembling the quick connector of the clustered heat dissipation device according to the third embodiment of the present invention.

The quick connector 3 comprises an outer sleeve element 31 and an inner sleeve element 32. The outer sleeve element 31 comprises an outer sleeve body 311. The two ends of the outer sleeve body 311 are formed as a narrow opening part 311A and a wide opening part 311B, respectively. The narrow opening part 311A is connected with the connection pipe 18A or the connection pipe 18B. The inner sleeve element 32 comprises an inner sleeve body 321 and a covering part 322. At least one ring-shaped recess 321A is formed in an external periphery 321B of the inner sleeve body 321 and located near the outer sleeve body 311. A gasket 33 (e.g., an O ring) is received in the ring-shaped recess 321A. The covering part 322 is formed on the external periphery 321B of the inner sleeve body 321 and located near the heat-absorbing manifold 11 (i.e., at the position away from the outer sleeve body 311). Moreover, an elastic coil 34 (e.g., a spring coil) is arranged between the covering part 322 and the inner sleeve body 321. In an embodiment, the covering part 322 and the inner sleeve body 321 are integrally formed as a one-piece structure. Alternatively, the covering part 322 and the inner sleeve body 321 are two different components that are combined together by a coupling means, a laminating means, a welding means or any other appropriate connecting means.

Please refer to FIGS. 8C, 8D and 8E. As for the size and shape, the internal periphery 311C of the outer sleeve body 311 and the external periphery 321B of the inner sleeve body 321 match each other. Consequently, the outer sleeve element 31 and the inner sleeve element 32 of the quick connector 3 can be jointed with each other along the axial direction. As mentioned above, the external periphery 321B of the inner sleeve body 321 is equipped with the ring-shaped recess 321A and the gasket 33. Consequently, during the process of jointing the inner sleeve body 321 with the covering part 322, the gasket 33 received in the ring-shaped recess 321A is compressed by the internal periphery 311C of the outer sleeve body 311. Since the gasket 33 is compressed and subjected to deformation, the seam between the internal periphery 311C of the outer sleeve body 311 and the ring-shaped recess 321A is completely occupied, the cooling liquid is not leaked out.

Please refer to FIGS. 8C, 8D and 8E. For avoiding the detachment of the outer sleeve element 31 from the inner sleeve element 32 along the axial direction, associated components of the quick connector 3 should be specially designed. As mentioned above, the covering part 322 is formed on the external periphery 321B of the inner sleeve body 321, and the outer sleeve body 311 has the wide opening part 311B. The covering part 322 has an entrance 322A and an accommodation space 322B. As shown in the cross-sectional view, the accommodation space 322B is internally extended from the entrance 322A. In this embodiment, the accommodation space 322B is an arc-shaped space with a narrow outer side and a wide inner side. The elastic coil 34 is disposed within the accommodation space 322B.

Please refer to FIG. 8D. After the wide opening part 311B of the outer sleeve body 311 is penetrated through the entrance 322A of the covering part 322, the wide opening part 311B is continuously moved to press the elastic coil 34 and expand the elastic coil 34 along the arc-shaped space. As the wide opening part 311B of the outer sleeve body 311 is continuously moved and transferred across the elastic coil 34, the elastic coil 34 is sheathed around the wide opening part 311B and retracted back in response to the profile of the elastic coil 34. Afterwards, the elastic coil 34 is locked between the entrance 322A and the wide opening part 311B. Under this circumstance, the entrance 322A of the covering part 322 is closed by the elastic coil 34, and thus the wide opening part 311B of the outer sleeve element 31 is securely locked in the accommodation space 322B. Even if an external pulling force is applied to the outer sleeve element 31, the wide opening part 311B of the outer sleeve element 31 is not detached from the covering part 322. Consequently, the outer sleeve element 31 and the inner sleeve element 32 are not detached from each other along the axial direction.

In case that the user intends to detach the outer sleeve element 31 from the inner sleeve element 32 in the future, the user may insert a tubular tool into the region between the wide opening part 311B and the elastic coil 34 to prop open the elastic coil 34. After the locked state of the outer sleeve element 31 and the inner sleeve element 32 is released, the outer sleeve element 31 and the inner sleeve element 32 are detached from each other along the direction reverse to the assembling direction.

While a heat-dissipating function of the clustered heat dissipation device 1 is executed, the cooling liquid is introduced or injected into the inner connection pipes. While the cooling liquid is transferred through the heat-absorbing manifold, the connection pipes and the heat-absorbing heads, the cooling liquid may be maintained in the liquid state. Alternatively, the cooling liquid undergoes liquid-gas transformation. That is, the cooling liquid is transformed into the vapor to carry away the heat. In case that the cooling liquid for undergoing the liquid-gas transformation is selected, the cooling liquid is an engineered fluid with low boiling point. For example, the cooling liquid is 3M Fluorinert FC-72 (boiling point is 56° C.), 3M Novec Fluids 7000 (boiling point is 34° C.) or 3M Novec Fluids 7100 (boiling point is 61° C.). Due to the low boiling point, the cooling liquid is readily transformed into the gaseous state after the temperature of the cooling liquid is increased. Consequently, while the cooling liquid is expanded and pressurized, a great deal of heat is carried away.

In accordance with the present invention, the clustered heat dissipation device is responsible of absorbing the heat from the heat sources and transferring the heated cooling liquid to the outside. After the heated cooling liquid is cooled down, the cooling liquid is returned to the clustered heat dissipation device to absorb the heat from the heat sources again. The cooling liquid is circulated. Optionally, the clustered heat dissipation device and a condenser, a cooler, a control system (e.g., a coolant distribution unit, CDU), a pump and connection pipes are collaboratively defined as a large-sized heat dissipation system (e.g., a rack-type heat dissipation system).

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A clustered heat dissipation device, comprising:
    a heat-absorbing manifold comprising an inlet chamber and an outlet chamber, wherein the inlet chamber comprises at least one first liquid inlet and plural first liquid outlets, the outlet chamber comprises plural second liquid inlets and at least one second liquid outlet, and the heat-absorbing manifold is in thermal contact with a first heat source;
    plural heat-absorbing heads; and
    plural connection pipes connected with the heat-absorbing heads and the corresponding first liquid outlets and connected with the heat-absorbing heads and the corresponding second liquid inlets.

2. The clustered heat dissipation device according to claim 1, wherein the heat-absorbing heads are in thermal contact with a second heat source.

3. The clustered heat dissipation device according to claim 2, wherein the first heat source and the second heat source are different heat generation elements, or the first heat source and the second heat source are different heat generation sites of a same heat generation element.

4. The clustered heat dissipation device according to claim 1, wherein the inlet chamber and the outlet chamber are separately arranged along a vertical direction, or the inlet chamber and the outlet chamber are separately arranged along a horizontal direction.

5. The clustered heat dissipation device according to claim 1, wherein each of the heat-absorbing head has a single-compartment structure or a multi-compartment structure.

6. The clustered heat dissipation device according to claim 1, wherein the heat-absorbing manifold is made of silver, copper, gold, aluminum, iron, alloy, or graphite, wherein the alloy contains one of silver, copper, gold, aluminum or iron.

7. The clustered heat dissipation device according to claim 1, wherein while a heat-dissipating function of the clustered heat dissipation device is executed, a cooling liquid is introduced into the connection pipes.

8. The clustered heat dissipation device according to claim 7, wherein the first liquid inlet is connected with a cooling liquid supply pipe, wherein the cooling liquid with a decreased temperature is received by the first liquid inlet and transferred to the plural heat-absorbing heads through the plural first liquid outlets.

9. The clustered heat dissipation device according to claim 7, wherein the second liquid outlet is connected with a cooling liquid exhaust pipe, wherein the cooling liquid with an increased temperature is transferred to an external condenser or an external heat exchanger so as to be cooled down.

10. The clustered heat dissipation device according to claim 1, further comprising a quick connector, wherein the quick connector is connected with a corresponding one of the first liquid outlets and a first corresponding one of the connection pipes or connected with a corresponding one of the second liquid inlets and a second corresponding one of the connection pipes.

11. The clustered heat dissipation device according to claim 10, wherein the quick connector comprises:
    an outer sleeve element comprises an outer sleeve body with a wide opening part;
    an inner sleeve element comprising an inner sleeve body and a covering part, wherein the covering part comprises an entrance and an accommodation space; and
    an elastic coil,
    wherein when the outer sleeve element and the inner sleeve element are jointed with each other, the elastic coil is sheathed around the wide opening part, so that the wide opening part is locked in the accommodation space.

12. The clustered heat dissipation device according to claim 11, wherein a ring-shaped recess is formed in an external periphery of the inner sleeve body, and a gasket is received in the ring-shaped recess.

13. A chassis, comprising:
an electronic device with at least three heat sources;
plural heat-absorbing heads in thermal contact with at least two of the at least three heat sources; and
a heat-absorbing manifold connected with a cooling liquid supply pipe and a cooling liquid exhaust pipe, wherein after a cooling liquid is distributed to the plural heat-absorbing heads and transferred through the plural heat-absorbing heads, a temperature of the cooling liquid is increased and the cooling liquid is collected to the cooling liquid exhaust pipe,
wherein the heat-absorbing manifold is in thermal contact with one of the at least three heat sources.

14. The chassis according to claim 13, wherein the heat sources are individual heat generation elements, or the heat sources are different heat generation sites of the same heat generation element.

15. The chassis according to claim 13, wherein the heat-absorbing manifold comprises an inlet chamber and an outlet chamber, wherein the inlet chamber is connected with the cooling liquid supply pipe, and the outlet chamber is connected with the cooling liquid exhaust pipe.

16. The chassis according to claim 15, wherein the inlet chamber is in thermal contact with the one of the at least three heat sources.

17. The chassis according to claim 15, wherein the outlet chamber is in thermal contact with the one of the at least three heat sources.

18. The chassis according to claim 15, wherein the inlet chamber is connected with the plural heat-absorbing head through corresponding quick connectors and the corresponding connection pipes.

19. The chassis according to claim 15, wherein the outlet chamber is connected with the plural heat-absorbing head through corresponding quick connectors and the corresponding connection pipes.

20. The chassis according to claim 13, wherein the heat-absorbing manifold is made of silver, copper, gold, aluminum, iron, alloy, or graphite, wherein the alloy contains at least one of silver, copper, gold, aluminum and iron.

* * * * *